US005525157A

United States Patent [19]
Hawkins et al.

[11] Patent Number: 5,525,157
[45] Date of Patent: * Jun. 11, 1996

[54] GAS INJECTORS FOR REACTION CHAMBERS IN CVD SYSTEMS

[75] Inventors: Mark R. Hawkins, Mesa; McDonald Robinson, Paradise Valley, both of Ariz.

[73] Assignee: Advanced Semiconductor Materials America, Inc., Phoenix, Ariz.

[*] Notice: The portion of the term of this patent subsequent to Jun. 22, 2010, has been disclaimed.

[21] Appl. No.: 514,420

[22] Filed: Aug. 11, 1995

Related U.S. Application Data

[63] Continuation of Ser. No. 171,265, Dec. 21, 1993, Pat. No. 5,458,918, which is a continuation of Ser. No. 882,489, May 13, 1992, which is a continuation of Ser. No. 782,060, Dec. 16, 1991, Pat. No. 5,411,590, which is a continuation of Ser. No. 364,708, Jun. 9, 1989, abandoned, which is a division of Ser. No. 66,019, Jun. 24, 1987, Pat. No. 5,221,556.

[51] Int. Cl.$^6$ .................................................... C23C 16/00
[52] U.S. Cl. ............................ 118/715; 118/725; 118/730
[58] Field of Search ..................................... 118/715, 725, 118/730, 50.1; 156/611; 427/248.1

[56] References Cited

U.S. PATENT DOCUMENTS

| | | | |
|---|---|---|---|
| 3,293,074 | 12/1966 | Nickl | 117/201 |
| 3,338,209 | 8/1967 | Bhola | 118/49.5 |
| 3,516,811 | 6/1970 | Gatchet et al. | 65/60 |
| 3,750,620 | 7/1973 | Eversteijn et al. | 118/48 |
| 3,785,853 | 1/1974 | Kirkman et al. | 117/106 |
| 4,033,286 | 7/1977 | Chern et al. | 118/49 |
| 4,096,822 | 6/1978 | Yamawaki et al. | 118/48 |
| 4,434,742 | 3/1984 | Hinaff et al. | 118/723 |
| 4,499,853 | 2/1985 | Miller | 118/725 |
| 4,583,492 | 4/1986 | Cowher et al. | 118/723 |
| 4,756,272 | 7/1988 | Kessler et al. | 118/715 |
| 4,807,562 | 2/1989 | Sandys | 118/725 |
| 4,825,809 | 5/1989 | Mieno | 118/725 |
| 4,836,138 | 6/1989 | Robinson | 118/666 |
| 4,839,145 | 6/1989 | Gale | 422/245 |
| 4,846,102 | 7/1989 | Ozias | 118/730 |

(List continued on next page.)

FOREIGN PATENT DOCUMENTS

| | | | |
|---|---|---|---|
| 0473067 | 3/1992 | European Pat. Off. | |
| 60-189928 | 9/1985 | Japan | |
| 30119 | 1/1990 | Japan | 118/715 |

OTHER PUBLICATIONS

Wang, C. A., et al., "Flow Visualization Studies for Optimization of OMVPE Reactor Designs," Journal of Crystal Growth, vol. 77, Sep. 1966, pp. 136–143.

*Primary Examiner*—R. Bruce Breneman
*Assistant Examiner*—Jeffry Lund
*Attorney, Agent, or Firm*—Knobbe, Martens, Olson & Bear

[57] ABSTRACT

The present invention relates to improved injectors for use in CVD reactor systems, and more specifically for use in epitaxial deposition systems for processing a single wafer-at-a-time. The improved injectors of the present invention are used to provide a predetermined desired shaped velocity profile for the injected reactant gases for insuring a more uniform deposition on a single wafer to be processed within the reactor system. In the first embodiment, the reactant gas is fed into a horizontal gas distribution manifold cavity and distributed horizontally in both directions. The gas then passes through a manifold wall having a pattern of predetermined sized and spaced apertures therein. The size of the apertures and the distribution of these sizes, shapes the resultant velocity profile to a desired pattern. Since the volume flow rate through each aperture of the manifold member increases as the diameter of the aperture increases, the resultant velocity profile produced will have its maximum at the center where the largest apertures exist and its minimum at the sides where the smallest apertures exist and the velocity profile will have a desired predetermined shape as it exits the gas delivery chamber and is turned 90 for injection into the input of the reaction chamber. In an alternate embodiment, a plurality of linearly dimensioned slots are provided between spacer legs for producing the predetermined desired shaped velocity profile.

7 Claims, 5 Drawing Sheets

U.S. PATENT DOCUMENTS

| | | | |
|---|---|---|---|
| 4,920,918 | 5/1990 | Adams | 118/724 |
| 4,949,669 | 8/1990 | Ishii et al. | 118/719 |
| 5,000,113 | 3/1991 | Wang et al. | 118/723 |
| 5,044,315 | 9/1991 | Ozias | 427/719 |
| 5,186,756 | 2/1993 | Benko et al. | 118/730 |
| 5,221,556 | 6/1993 | Hawkins et al. | 427/255 |
| 5,244,694 | 9/1993 | Ozias | 427/248.1 |
| 5,261,960 | 11/1993 | Ozias | 118/719 |
| 5,269,847 | 12/1993 | Anderson et al. | 118/715 |
| 5,411,590 | 5/1995 | Hawkins et al. | 118/715 |
| 5,458,918 | 10/1995 | Hawkins et al. | 427/248.1 |

GAS INJECTORS FOR REACTION CHAMBERS IN CVD SYSTEMS

This application is a continuation of U.S. patent application Ser. No. 08/171,265, filed Dec. 21, 1993, now U.S. Pat. No. 5,458,918 which was a continuation of U.S. patent application Ser. No. 07/882,489, filed May 13, 1992, which was a continuation of U.S. patent application Ser. No. 782,060, now U.S. Pat. No. 5,411,590, issued May 2, 1995, which was a continuation of U.S. Ser. patent application Ser. No. 07/364,708, now abandoned, which is a divisional of U.S. patent application Ser. No. 066,019, now U.S. Pat. No. 5,221,556, issued Jun. 22, 1993.

BACKGROUND OF THE INVENTION

1. Field of the Invention

The present invention relates generally to improved reactant gas injectors for use in reaction chambers used in Chemical Vapor Deposition (CVD) systems, and more particularly, to improved reaction chamber apparatus for use in CVD systems wherein improved gas injectors are used for producing a predetermined desired shaped velocity profile of the injected gas for providing more efficient depositions on the substrate(s) or wafer(s) to be processed.

2. Description of the Prior Art

Chemical Vapor Deposition (CVD) is the formation of a stable compound on a heated substrate by the thermal reaction or decomposition of certain gaseous components. Epitaxial growth is a highly specific type of CVD that requires the crystal structure of the substrate or wafer be continued through the deposited layer.

Chemical Vapor Deposition systems take many forms but the basic components of any CVD system usually include a reaction chamber which houses the wafers, a gas control section, a timing and sequence control section, a heat source, and an effluent handling component. A great variety of ways of implementing each of these components leads to a great number of individual reactor configurations in the prior art systems.

The purpose of the reaction chamber is to provide a controlled environment for the safe deposition of stable compounds. The chamber boundary may be quartz, stainless steel, aluminum, or even a blanket of non-reacting, gas such as nitrogen. Commercial epitaxial reaction chambers are generally classified as being one of the following three general types, depending primarily upon gas flow. Horizontal systems are those systems wherein the wafers are placed horizontally on a boat or susceptor and the gas flows horizontally in one end of the chamber or tube, across the wafers, and out the other end of the chamber. In vertical systems, the wafers are placed horizontally on a susceptor and the gas flows vertically towards the wafers from the top and the susceptor is normally rotated to provide a more uniform temperature and gas distribution. Lastly, in cylindrical or barrel reactor systems, the wafers are placed vertically on the outer surface of a cylinder, and the gases flow vertically into the chamber from the top and pass over the wafers on the susceptor which rotates for uniformity.

Heating in a cold-wall CVD system is accomplished through the use of radio frequency (RF) energy, or radiation energy commonly in the ultraviolet (UV) or infrared (IR) band or the like. In an RF heated susceptor, the energy in an RF coil is coupled into a silicon carbide coated carbon susceptor. The wafers are heated through their contact with the susceptor. Radiant and UV or IR heating is accomplished by the use of high intensity lamps that emit strongly in the ultraviolet, visible, and/or infrared spectrums. The large amounts of energy from these lamps heat the we farm and their holders by radiation. In both types of cold-wall heating, the walls of the chamber are cold, in comparison to the wafers themselves. The chamber walls must be cooled to prevent radiation from the lamps and the susceptor from producing a large temperature rise.

The reaction chamber is used in epitaxial deposition systems to provide a carefully controlled environment needed for the epitaxial deposition to take place and it is a critical component of the system. Prior to reactor heat-up, any residual air that remains in the chamber must be removed. During cool down, following the deposition cycle, any gases remaining from the growth process must be flushed out. The various gases used epitaxial reaction chambers include a non-reactive purge gas which is used at the start and at the end of each deposition for accomplishing the above. The non-reactant purge gas, usually nitrogen, is used to flush or purge unwanted gases from the reactor chamber.

A carrier gas is used before, during, and after the actual growth cycle. The carrier gas maintains uniform flow conditions in the reactor. As the gases responsible for etching, growth, or doping the silicon are added, the flow rate of the carrier gas remains steady. Hydrogen is most often used as a carrier gas, although helium is sometimes employed.

Etching gases are used prior to the actual epitaxial deposition wherein etching is performed to remove the thin layer or layers of silicon from the surface of the wafer to be processed along with any foreign matter or crystal damage that is present on it. The etching prepares atomic sites for nucleating or initiating the epitaxial deposition process.

The carrier gas is normally hydrogen and the source gases for silicon conventionally used for epitaxial depositions include Silane ($Si_4$); Dichlorosilane ($SiH_2Cl_2$); Trichlorosilane ($SiHCl_3$); and Silicon tetrachloride ($SiCl_4$). The dopant gases normally used in epitaxial deposition include Arsine ($AsH_3$); Phosphine ($PH_3$); and Diborane ($B_2H_6$). The etching gas most commonly used is Hydrochloric acid (HCl).

The problems inherent in all prior art systems of CVD, and more particularly in epitaxial deposition systems, include non-uniform deposition on the surface of the wafer or wafers to be processed; the presence of particulates and/or contaminants in the reaction chamber on the wafer or substrates to be processed; wall deposits formed on the interior walls of the reactor chamber; depositions of the reactant chemicals on the heated susceptor and its support structure; inefficient gas flow characteristics; slow processing times; non-uniform depositions due to uncontrolled gas velocity profiles; and the like.

These problems become even more important with the modern trend away from batch processing systems and toward a single wafer or one substrate-at-a-time processes. In a single wafer-at-a-time processing system, the same volume of gas normally flowing through a reaction chamber with many wafers to be processed cannot be used, since too much gas will be consumed for one wafer. Still further, the cycle time to process a batch of wafers in a conventional batch processing chamber is far too long for single wafer processing.

A single wafer process requires a much more rapid deposition rate to minimize the cycle time. In a single wafer deposition system, the build-up of wall deposits from reaction by-products form far more rapidly on a single wafer basis than on a batch system basis, and thus requires that a minimum of wall deposits be formed or controlled to a type that can be easily cleaned using conventional gas etching techniques.

It is an object of the present invention to provide an improved reaction chamber apparatus for use in a CVD processing system.

It is another object of the present invention to provide an improved reaction chamber apparatus for use in a CVD processing system for processing a single substrate or wafer on a one-at-a-time basis.

It is still another object of the present invention to improved reaction chamber having gas injector means for producing a predetermined desired shaped velocity profile.

It is yet another object of this invention to provide an improved gas injector for a CVD system.

It is a further object to provide an improved single wafer CVD reaction chamber having an improved gas injector for producing a more uniform deposition than was heretofore possible.

it is still a further object of this invention to provide an improved reaction chamber having gas injector means for producing a shaped velocity profile for producing a faster processing time in a single wafer CVD system without wasting reactant gases.

It is yet another object of this invention to provide an improved gas injector for a reaction chamber wherein the velocity profile of the injected gas may be selectively controlled for optimum uniformity of deposition.

It is a further object of this invention to provide an improved reaction chamber having improved reactant gas injector means.

The present invention provides an improved reactant gas injector means for reaction chambers in CVD systems, and more particularly, for reaction chambers used in epitaxial deposition systems. The primary use of the improved gas injectors of the present invention is in CVD systems adapted for processing a single wafer-at-a-time, although the gas injectors of the present invention can be used in multiple or batch processing systems or wherever it is desired to have a controllably shaped velocity profile for the injected reactant gases. A first reactant gas injector is provided with an aperture of sized and dimensioned holes while a second embodiment of a reactant gas injector is utilized having variable width and/or height slots in a manifold which is provided for producing a more uniform gas flow with a predetermined shaped or desired velocity profile.

The reactant gas injection means of the preferred embodiment of the present invention is operatively disposed at the input of the reaction chamber for injecting reactant gas at a predetermined flow rate and for producing a desired velocity profile across the surface of the wafer or wafers to be processed, thereby producing at least-one of a linear and a uniform deposit thereon.

In the first embodiment of the reactant gas injector means of the present invention, a unitary single body Is defined as having a first elongated body portion having a generally rectangular cross-section extending laterally across the width of the reaction chamber and disposed above the top panel thereof. A second elongated body portion having a generally rectangular cross-section is integral with the first elongated body portion is disposed below the plane of the bottom panel. A hollow reactant gas cavity is disposed between the bottom surface of the top body portion and the top surface of the bottom body portion, and the outlet from the hollow reactant gas cavity is substantially coterminous with the reaction gas input at the front end of the reaction chamber.

Means operatively disposed between the exterior sides of the top and bottom elongated body portions are provided for closing the opposite end of the hollow reactant gas cavity. A gas inlet is operatively disposed on the top of the first body portion along the central longitudinal axle of the reaction chamber. Means are provided for supplying a reactant gas under pressure to the gas inlet. A gas distribution manifold chamber extends laterally across the length of the first body portion for distributing reactant gas in both horizontal directions therethrough. A gas-receiving passage operatively couples the gas inlet to the gas distribution manifold chamber.

A gas delivery chamber is provided along with an elongated manifold member for operatively separating the gas distribution manifold chamber from the gas delivery chamber. A plurality of gas distribution apertures are operably disposed in the manifold member across the length thereof for communicating the reactant gas from the gas distribution manifold chamber to the gas delivery chamber. The apertures are spaced at predetermined desired intervals and/or have predetermined desired dimensions such that the smaller apertures are formed at the exterior ends of said manifold member and the apertures become larger toward the center of the manifold member. The gas delivery chamber has an outlet disposed substantially perpendicular to the hollow reactant gas cavity for injecting a flow of reactant gas vertically downward into the hollow reactant gas cavity. The injected gas has a flow distribution and a predetermined desired velocity profile for insuring a uniform deposition on the wafer or wafers to be processed within the reaction chamber.

In an alternate embodiment to the injector means of the preferred embodiment, a manifold member is provided for substantially closing the outlet of the reactant gas distribution channel into the hollow reactant gas cavity. The manifold member includes a plurality of spacer legs operatively disposed between one surface thereof and a wall of the gas distribution manifold chamber. The spacer legs provide formed or shaped slots therebetween. The dimensions of the slots increasing toward the central spacer leg and decreasing toward the edge spacers. The reactant gas passes through the shaped slots of the gas distribution manifold chamber to the hollow reactant gas cavity in a substantially vertically downward direction such that the gas flow is turned at approximately 90° to a horizontal direction within the hollow reactant gas cavity for providing a gas flow pattern with a predetermined desired shaped velocity profile which is controlled by the shape of the slots for providing a more uniform deposition on the wafer or wafers to be processed within the reaction chamber.

The improved injectors of the present Invention can be used in either a batch processing system or a single wafer-at-a-time processing system. In the preferred embodiment, however, the improved injectors are used in a single wafer-at-a-time epitaxial deposition system.

These and other objects and advantages of the present invention will be more fully understood after reading the Detailed Description of the Preferred Embodiments of the present invention, the Claims, and the Drawings, which are briefly described hereinbelow.

DETAILED DESCRIPTION OF THE PREFERRED EMBODIMENTS

Figure 1:
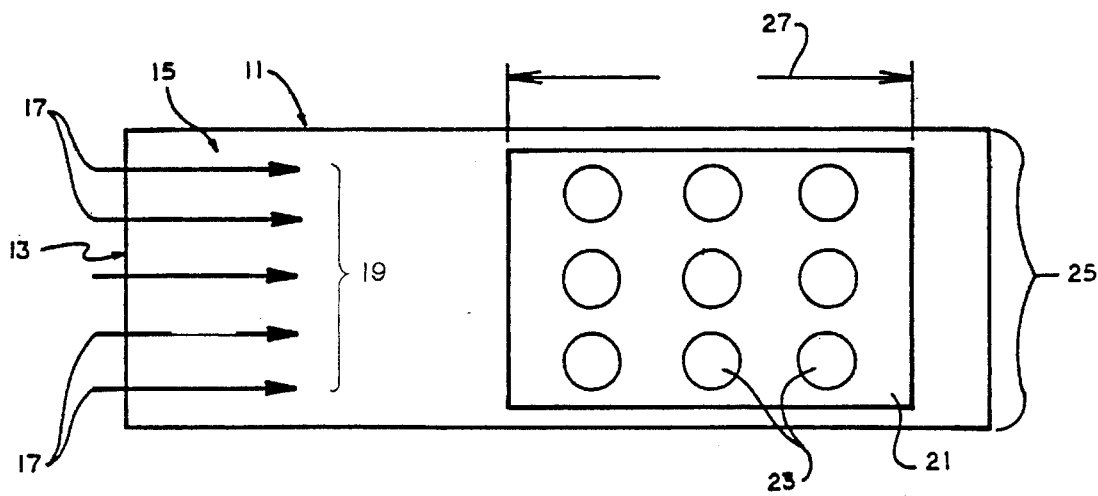
FIG. 1 top view of a prior art system for injecting a uniform reactant gas flow into a batch processing reactor system.

FIG. 1 illustrates a chemical vapor deposition (CVD) system 11 of The prior art used for the batch processing of wafers. The reactor 11, includes a reactant gas input 13 which feeds or supplies the required gases 19 into the hollow interior 15 thereof. The injector is represented by reference numeral 17, and in the embodiment of FIG. 1, the injector is used to provide a uniform gas flow, as indicated by the arrows 19. The uniform gas flow passes through the hollow Interior 15 of the reactor 11 and flows uniformly across the susceptor or boat 21 having a plurality of wafers or substrates 23 positioned thereon. The gas then passes through the exhaust port or output 25 after it has uniformly passed over the wafers 23 and substrates 21 via the uniform length 27 of the susceptor 21. This type of uniform gas flow 19 is sufficient for Insuring a uniform deposition on the wafers 23 for the batch type reactor shown.

Figure 2:
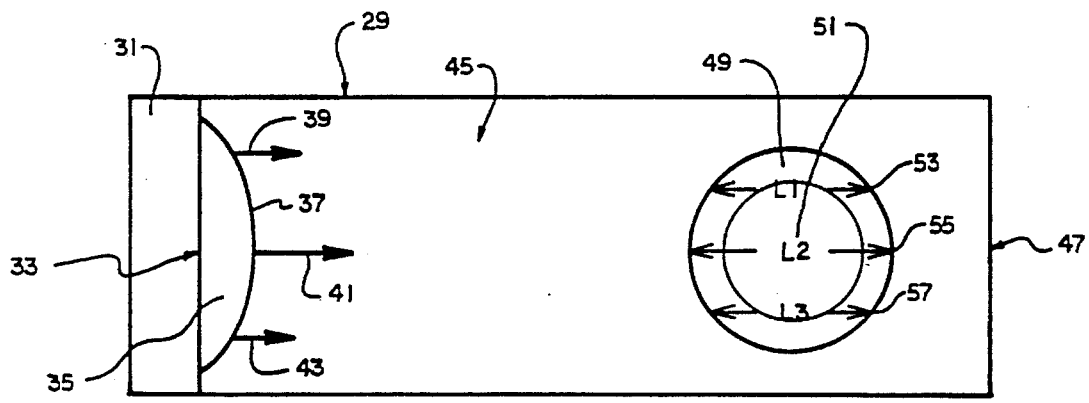
FIG. 2 is s a sectional top view illustrating an improved gas injector for injecting a reactant gas into a single wafer-at-a-time processing system wherein the gas' has a predetermined desired shaped velocity profile.

FIG. 2 illustrates a desired CVD reactor system 29, and preferably a reactor assembly 29 used in a epitaxial deposition system. In FIG. 2, the reactor 29 is provided with an improved injector 31 whose output supplies a gas flow to the input 33 of the reactor 29. The circular segment portion 35 represents the output of the improved injector 31 of the preferred embodiment of the present invention and includes a curved outer surface 37 bearing the gas flow arrows 39, 41 and 43 which are used to represent, not a uniform gas flow, but a shaped or predetermined desired velocity profile for the injected gases. The shaped velocity profile for the injected gas is then fed through the hollow interior 45 of the reactor 29 and caused to flow across a susceptor 49 having a single wafer 51 positioned thereon for processing. Before the gas passes through the output or exhaust port 47, it passes over different length paths 53, 55, and 57 on the susceptor 49. This would normally cause an uneven or non-uniform deposition. However, since the injector 31 of the improved epitaxial deposition system 29 has the gas input shaped to a predetermined velocity profile or distribution, the velocity of the gases along the different paths are controlled so that the flow across the different portions of the wafer 51 is shaped to a predetermined profile for insuring a uniform deposition of the wafer 51. The particular injectors 31 for accomplishing the shaped velocity profile of FIG. 2 will now be described.

Figure 3:
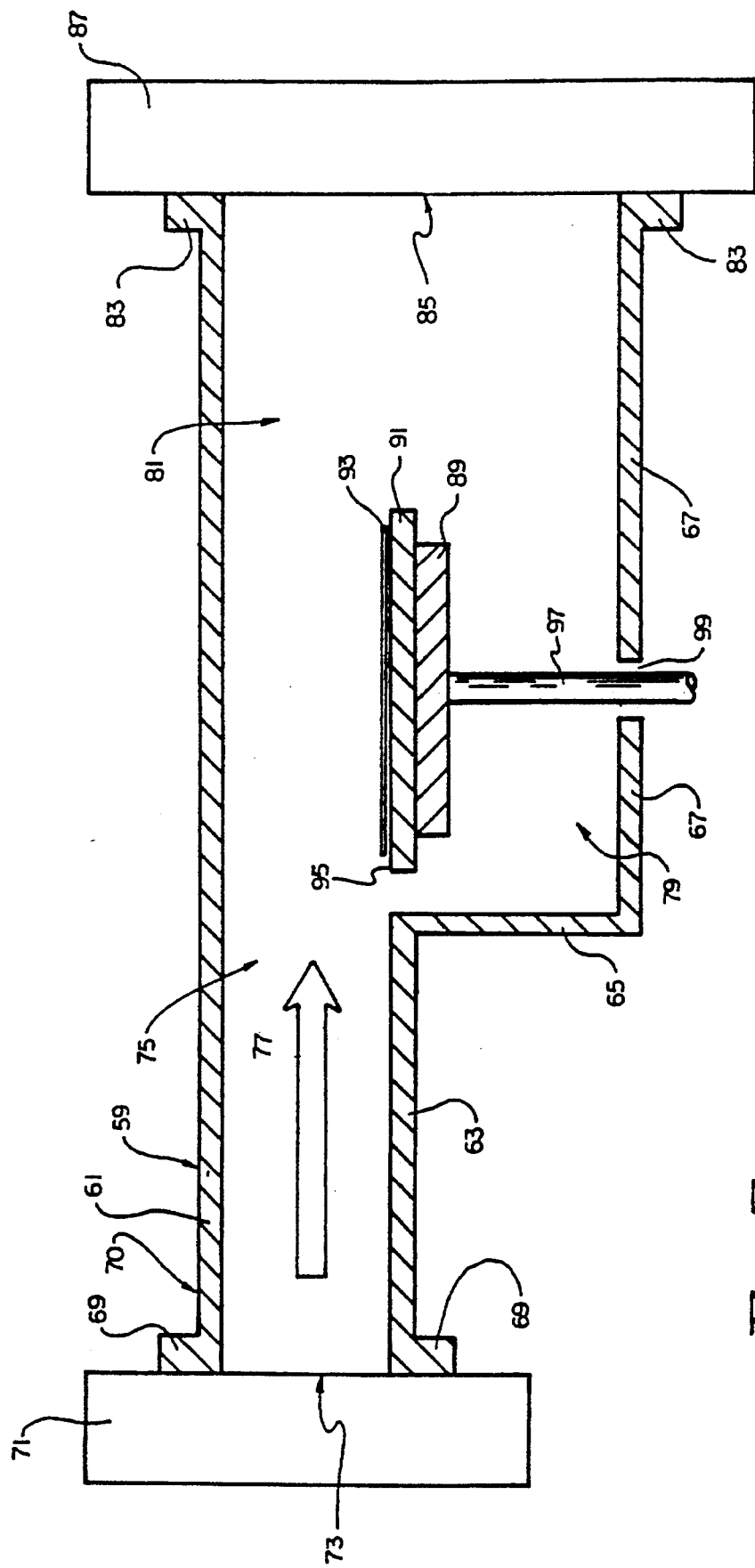
FIG. 3 is a schematic representation of a reaction chamber provide with the improved injector of the present invention.

FIG. 3 shows a conventional epitaxial deposition chamber 59 having a generally rectangular top planar panel 61 and a corresponding generally rectangular bottom panel 63. A vertical wall portion 65 separates the first floor panel 63 from a second lower floor panel 67. The front end 70 of the reactor 59 is provided with a pair of flange portions 69 to which the reactant gas injector 71 of the present invention is secured. The output of the injector 71 is taken as the input 73 to the reactor 59, and the gas flow arrows 77 are used to represent the shaped velocity profile of the injected gases. The well area 79 and the hollow rear portion 81 are used for housing the susceptor assembly, as hereinafter described. A pair of flanges 83 at the rear end of the reactor 59 are typically connected to an exhaust port 87, and the exhaust or spent gases pass through the exhaust output 85 of the reactor 59 via the port 87.

A pedestal 89 is horizontally positioned within the well area 79 and forward of the rear area 81. The pedestal 89 positions a susceptor 91 having a relatively flat top surface 95 thereon and a wafer or substrate 93 is removably mounted or positioned upon the flat surface 95 of the susceptor 91. In the preferred embodiment of the present invention, the reactor 59 is used for processing a single wafer-at-a-time, as illustrated in FIG. 3. A shaft 97 extends from the bottom of the pedestal 89 through the outlet 99 in the floor portion 67 of the reactor tube or envelope 59 for rotation or height adjustment purposes.

It will be understood that the improved injector 71 of FIG. 3 can be used with various types, shapes, and configurations of reactor envelopes and various types of CVD systems including epitaxial deposition systems. Its use is not necessarily restricted to use with a single wafer-at-a-time system, but it finds particular advantages for use therein. It can, however, be used in batch processing modes, particularly where the boat or substrate positioning the wafers is not a linear array. For example, three wafers evenly spaced on a single susceptor.

Figure 4:
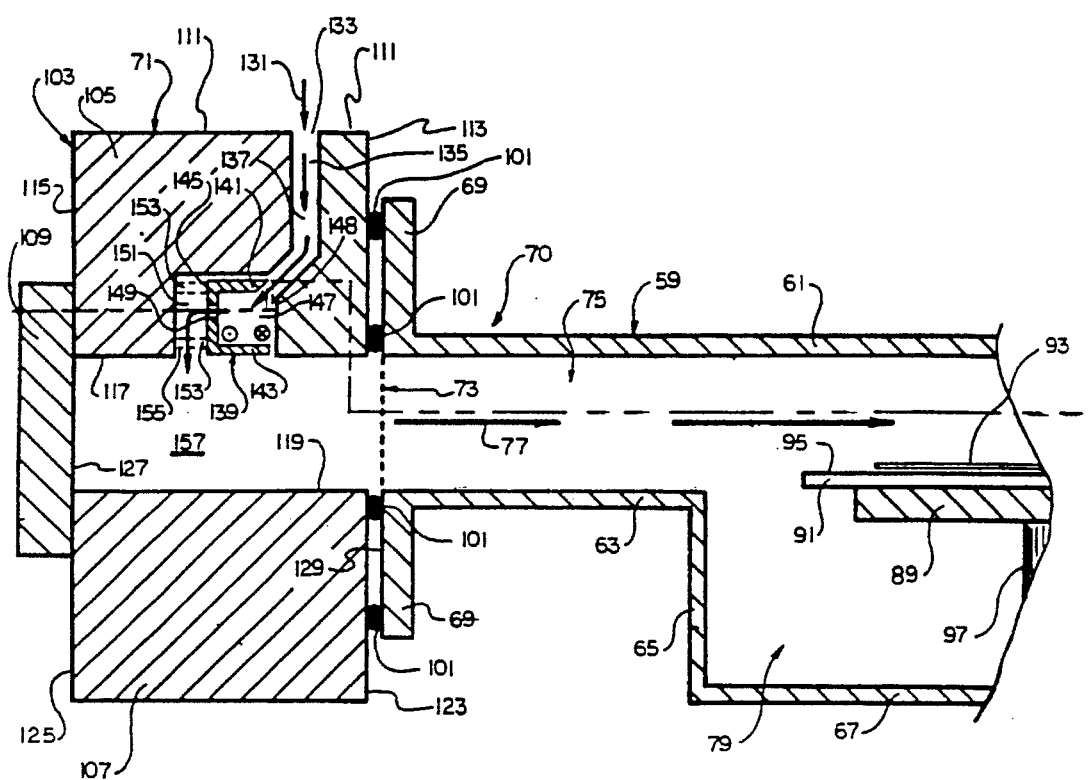
FIG. 4 illustrates a first embodiment of the reaction gas injector of the present invention

FIG. 4 shows a partially sectional side view of the front end portion 70 of the reaction chamber 59 of the preferred embodiment of the present invention, together with the gate and injector assembly 71. The front end 129 of the reaction chamber 59 is shown as terminating in a flange portion 69. The flange portion 69 is separated from the front end portion 123 of the injector 71 by a plurality of gaskets or seal members 101, as known in the art. The reactant gas input 73 is defined as the entrance 73 to the hollow interior portion 75 of the reaction chamber 59 located between the interior surfaces of the walls 61 and 63 and the corresponding sides 165 (FIG. 5), not shown in FIG. 4, and through a plane taken along the end portion 129 of the flanges 69.

The injector 71 includes a single unitary block-like construction 103 having a top block or body portion 105 and a corresponding elongated bottom block or body portion 107. A reactant gas accumulation cavity 157 is disposed between the lower surface 117 of the top block portion 105 and the upper surface 119 of the lower block portion 107. The rear of the injector 71 includes a longitudinal rear closure member 109 whose rear surface 127 closes the rear of the gas accumulation cavity 157. The extended rear edge portions 127 of the closure member 109 pass over the rear surface 115 of the top block portion 105 and the rear portion 125 of the lower block portion 107 to close the rear of the accumulation cavity 157. Therefore, all sides of the reactant gas accumulation cavity 157 are closed except for the reactor input 73.

The top surface 111 of the top block portion 105 includes a reactant gas inlet aperture 133 which receives reactant gas from a supply 131. The inlet 133 is formed along a central portion of the top surface 111 and along the longitudinal centerline of the reaction chamber 59. The source of reactant gas 131 (hereinafter described with reference to FIGS. 10 and 11) supplies the reactant gas, as indicated by the gas flow direction arrow 131, into the reactant gas inlet aperture 133. The inlet 133 communicates through a relatively narrow gas-receiving passage 135 to a slanted passage portion 137 which empties into an elongated, laterally disposed, gas distribution manifold chamber 147. The manifold chamber is defined as the hollow interior 147 existing between the rear surface 148 and the interior of the manifold member 139. The manifold member 139 is a generally elongated, hollow, three-sided member having a C-shaped cross-section. The top portion of the C-shaped cross-section is designated by reference numeral 141, the bottom section by reference numeral 143, and the rear interconnecting vertical portion by the reference numeral 145. Therefore, the gas distribution chamber 147 exists between the interior surfaces of the gas distribution manifold members 141, 143, and 145 and the wall portion 148 of the body portion 105. The laterally disposed gas distribution manifold chamber 147 passes the reactant gases received from the output of the slanted channel portion 137 horizontally back and forth or to the left and right as indicated by the arrowhead symbols passing into and out of the page within the manifold distribution cavity 147.

The closed rear of the manifold 139, including the vertical wall portion 145, is provided with a row of apertures or outlets 149 therein. Once the gas has passed horizontally in both directions within the manifold chamber 147, it passes rearwardly through the outlets 149 in the manifold member 145 and into the gas outlet chamber delivery 151. The chamber 151 is provided with spacers 153 and has a vertical outlet at the bottom represented by reference numeral 155. The top wall portion 141 of the manifold member 139 may be sealed to the bottom of the top body portion 105 by a Teflon-gasket, and the bottom wall may be sealed to the surface through a similar gasket. The wall portion 145 extend longitudinally through the entire body portion 105 and defines the outlet portion of the gas distribution manifold cavity via the apertures 149. The manifold distribution cavity 147 receives the reactant gas from the passage 137 and delivers the reactant gas horizontally in both lateral directions through-out the remainder of the gas distribution manifold chamber 147.

A plurality of spaced and sized apertures 149 are disposed or located in the upper end portion of a stainless steel wall 145 of the manifold member 139 which separates the gas distribution manifold cavity 147 from a gas delivery channel or cavity 151. The gas delivery channel 151 includes the spacers 153 for spacing the manifold wall members therefrom and the gas flows through the pattern of apertures 149 horizontally into the gas delivery channel 151. The gas must then turn 90° vertically downward within the gas delivery channel 151 to empty vertically downward via the gas delivery channel outlet 155 into the cavity 157 as indicated by the reactant gas flow direction arrow exiting from the outlet 155.

Within the cavity 157, the vertically downward flow of gas must then turn 90° again toward the front 73 of the reactor 59 prior to being fed therein. The cavity 157 then changes the direction of the gas flow from vertical to horizontal and feeds it into the Input 73 of the reaction chamber 59 of the present invention.

In the preferred embodiment of the Injector of FIG. 4, the material from which the manifold wall member is constructed is stainless steel, and the pattern of apertures is selected to provide predetermined a desired velocity profile which, for a given gas flow rate at the reactant gas inlet 133, will provide a predetermined desired velocity profile of the reactant gas entering the gas inlet 73 of the reaction chamber 59 so that an optimum uniform deposition on the wafer 93 positioned therein will result.

Figure 5:
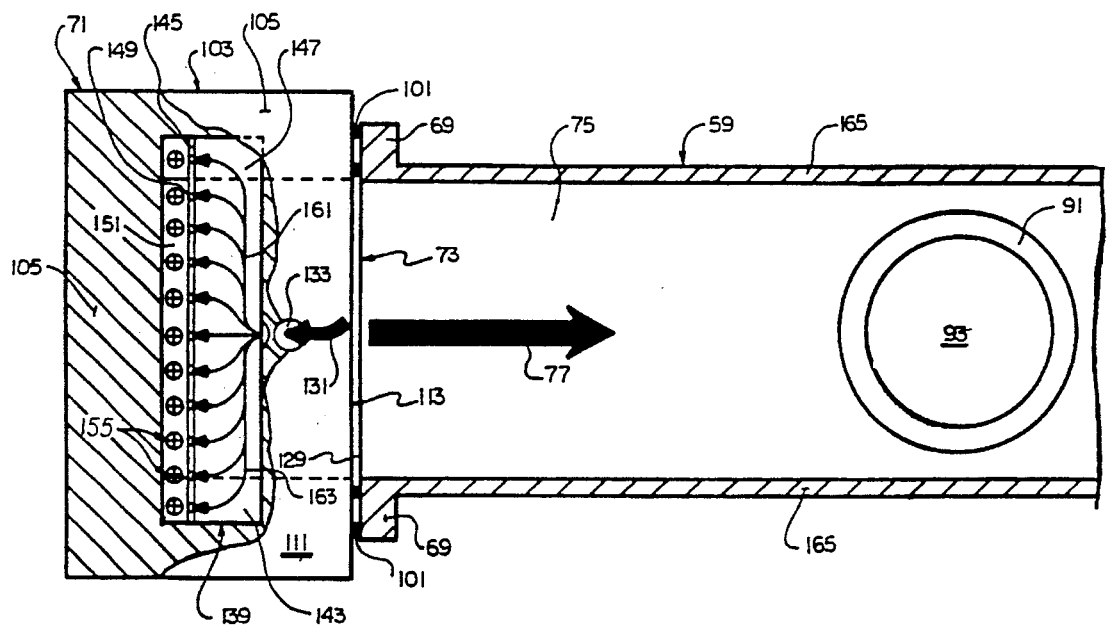
FIG. 5 illustrates a sectional top plan view of the injector of FIG. 4.

FIG. 5 shows a partially sectional top view of the injector end portion of the apparatus of FIG. 4. In FIG. 5, the upper block or body portion 105 is shown while the bottom block or body portion 107 is positioned thereunder and is not shown. The upper block portion 105 is shown as including a front portion having a central reactant gas inlet 133 thereon for receiving reactant gas from a source designated by the input arrow 131. A narrow gas-receiving passage, channel or conduit 135 then interconnects the reactant gas inlet 133 with the gas distribution manifold chamber 147. The gas is distributed horizontally in both lateral directions within the gas manifold distribution channel 147 as indicated by the flow arrows to the left 161 and to the right 163 within the channel 147.

The gas is then outputted rearwardly through the pattern of manifold apertures 149 formed within the front wall 145 of the manifold assembly 139. The reactant gas flows from the horizontal manifold gas distribution chamber 147 through the aperture outlets 149 and into the vertically disposed gas delivery chamber 151. The gas then flows vertically downward within the gas delivery chamber 151 and passes out of the gas delivery channel 151 through the gas delivery channel outlet 155 and into the reactant gas accumulator chamber 157. The gas is then turned 90° horizontally and directed to the input 73 of the reactor chamber 59 with a predetermined desired shaped velocity profile adapted to provide a uniform deposition coating on the single wafer 93 to be processed within the reaction chamber 59.

Figure 6:
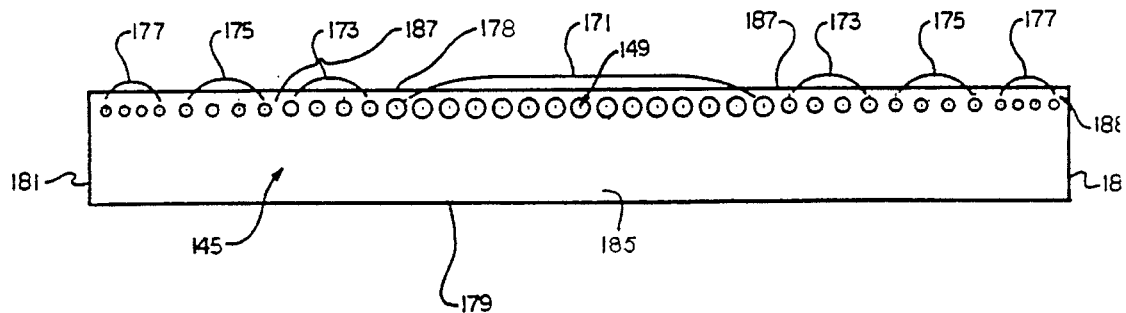
FIG. 6 illustrates the aperture pattern in the manifold member of the reactant gas injector of FIGS. 4 and 5.

The pattern of apertures 149 within the stainless steel wall 145 of the manifold assembly 139 is shown in detail in FIG. 6. In FIG. 6 it will be seen that the apertures 149 are located in the top end portion 187 of the wall member 145 having a lower end portion 185. The wall is a generally rectangular, substantially planar member 145 having a top edge surface 178, a bottom edge surface 179, a left portion 181, a right edge portion 183, a surface 179, a left edge portion 181, a right edge portion 183, a front surface 185 and a rear surface 187. The plurality of apertures 149 are operably disposed along the top portion 188 spaced adjacent the top edge surface 178 and arranged in groups as hereinafter described.

Each group of apertures is sized or dimensioned and to produce the desired velocity profile at the output of the injector. A first group 177 includes four apertures each having a relatively small diameter, such as 0.031 inches. The first group 177 Is followed by a second group 175 of four apertures each of which has a diameter slightly greater than the diameter of the apertures of the first group 177, such as 0.045 inches. Similarly, a third group 173 of apertures includes a set of four apertures each having a diameter slightly greater than the diameter of the apertures of the group 175, such as 0.064 inches. Lastly, a central group 171 includes 16 apertures each of which has the largest diameter of any of the groups 177, 175, and 173 such as 0.090 inches. The pattern is symmetrically repeated to the right of the central group 171 such that a group 173 of four apertures is to the right of the central group 171 and includes a set of four apertures each having a diameter slightly smaller than the diameter of the apertures of group 173 and equal to the diameter of the apertures of the left hand group, similarly designated by reference numeral 173. This is followed by a corresponding group of four apertures designated by reference numeral 175 wherein each of the apertures has a diameter slightly less than the diameter of the apertures of the group 173, and then by the end set of four apertures 177, wherein each of the apertures the smallest diameter of the manifold member 145.

Since the volume flow rate through each apertures 149 increases as the diameter of the aperture increases, a velocity profile will be produced, formed or shaped having its maximum at the center portion from the group 171 apertures 149 and its minimum at the outer side portions of the group 177 diameter apertures as it passes into the gas delivery chamber 151 and then into the cavity 157. As the gas flow is turned 90° from a vertical to a horizontal flow, a predetermined optimal velocity profile will be established for maximizing the uniformity of the deposition of the single wafer being processed as the gas passes through the reaction gas input 73 of the reaction as chamber 59.

Figure 7:
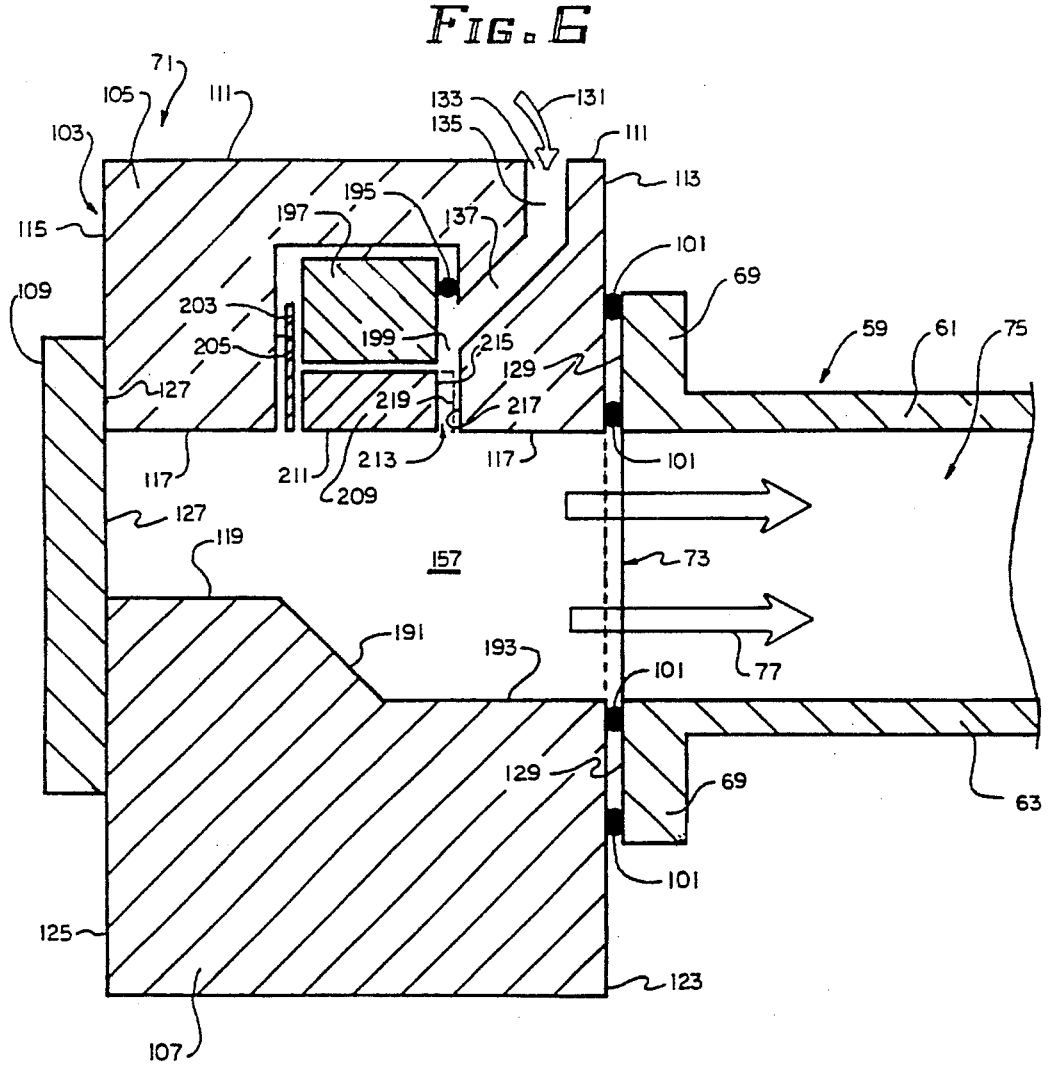
FIG. 7 illustrates an alternate embodiment of the reactant gas injector of the present invention.

An alternate embodiment to the injector 71 of FIGS. 4 and 5 is shown in FIG. 7 which is a cross-sectional view of the front end portion of the reaction chamber 59 showing the flanges 69 and the front end portion of the reaction chamber 59. The gas inlet 73 of the reaction chamber 59 is located or disposed between the top 61 and bottom 63 of the chamber 59 and the sides, which are not shown. The rear surface 129 of the flanges 69 are disposed against the surfaces 113 and 123 at the front end of the injector 71 to joint the reaction chamber 59 to the injector 71 via the seals 101. The shaped velocity profile of the reaction gases injected into the front end 73 of the reaction chamber 59 are represented by the gas flow direction arrows 77.

The alternate embodiment gas injector of FIG. 7 illustrates an injector 71 having a single unitary body 103 including an upper body or block portion 105 and a lower body or block portion 107. An interior gas collection cavity 157 is formed between the interior bottom surface 117 of the upper block portion 105 and the interior surfaces 119, the slanted surface 191 and the surface 193 of the lower block portion 107. The rear of the cavity is closed by a member 109 whose interior surface 127 overlaps the rear surface 115 of the upper block portion 105 and the rear surface 125 of the lower block portion 107 to seal or close the cavity with the interior surface 127 so that the cavity 157 is entirely bounded or confined except for the outlet which corresponds to the reaction chamber gas inlet 73. The outlet of the cavity 157 may be thought of as being coincident, coterminous, or coextensive with the input 73 of the epitaxial deposition chamber 59, as previously described.

Figure 10:
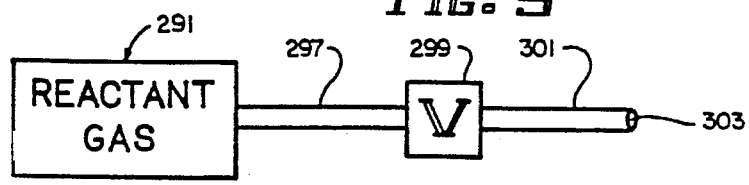
FIG. 10 illustrates a source of reactant gases for the injectors of FIGS. 4 and 7.
Figure 11:
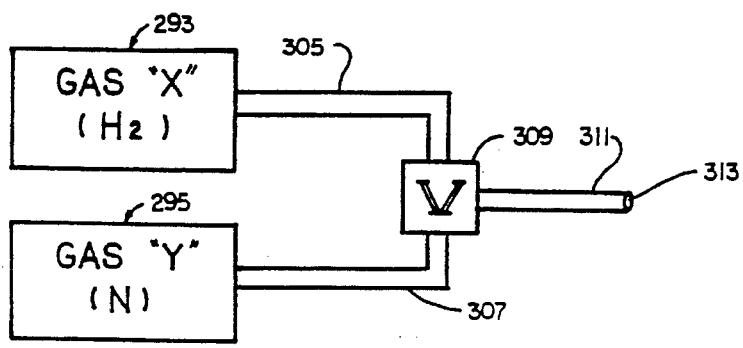
FIG. 11 illustrates a source of hydrogen and nitrogen for injection into the reaction chamber of the present invention.

The upper body portion 105 includes an upper surface 111 having a reactant gas inlet 133 for receiving the reactant gas from a source 131. The gas inlet 133 is disposed in a central portion of the surface 111 of the top block portion 105 and the central portion is along the longitudinal axis of the upper body or block 105 and along the center axis of the reaction chamber 59. A source of reactant gas, represented by the arrow 131, and as hereinafter described with reference to FIGS. 10 and 11, is supplied to the reaction gas inlet aperture 133 and then fed through the narrow gas-conducting vertical passage or conduit 135 into the slanted passage portion 137. The chamber 135, 137 then empties or distributes the reactant gas into the horizontally disposed chamber or slot 199. Within the chamber 199, the reactant gas is distributed horizontally in both directions. A spacer element 197 extends longitudinally through the upper block portion 105 and one edge is sealed from the body portion 105 by means of a Teflon-seal or gasket 195. A Teflon-gasket 203 seals the opposite side of the spacer 197 and an injector block 209 from a wall portion 205 of the upper body portion 105. The outlet of the gas distribution chamber is taken through the injector block 209 whose lower surface 211 communicates directly with the cavity 157. The longitudinal Injector block 209 controls the gas outlet from the gas distribution manifold chamber 199 via a precision outlet 213 disposed between the surface 215 of the Injector block 209 and the surface 219 of the body portion 105 which includes a plurality of spacer legs in formed slots 219 as hereinafter described.

Figure 8:
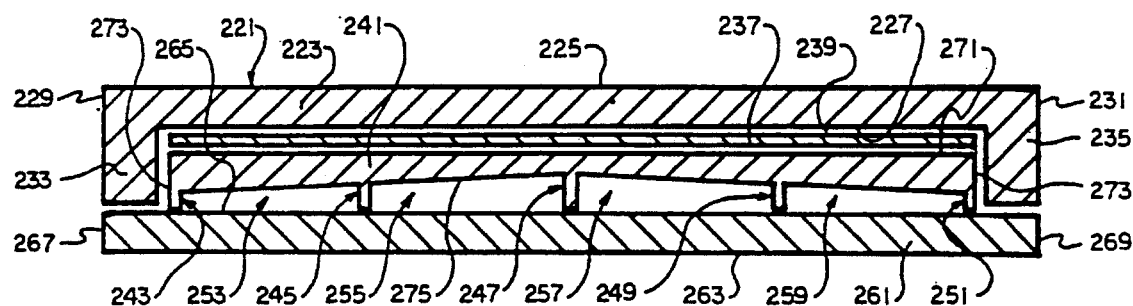
FIG. 8 is a cross-sectional view taken along view lines 8—8 of FIG. 7.

FIG. 8 illustrates a top view of the injector portion 209 of FIG. 7. The injector block 209 is shown as including an elongated block of material separated from the interior surface of the upper body 105 by a gasket or seal 195 which is preferably a Teflon-gasket. The injector body 209 is shown as having a plurality of spacer legs of various heights and various sizes or dimensioned gaps formed therebetween. The leg and gap portion is disposed between the surface 217 of the body portion 105 and the surface 215 of the injector block 209. A first relatively short spacer leg 243 is disposed at the left hand end portion of the injector member 241. Spaced a predetermined distance therefrom, a second spacer leg 245 is disposed. The second spacer leg 245 is larger or higher than the first spacer leg 243. A central spacer leg 247 is centrally disposed along the injector member 241 and is even larger or higher than the spacer leg 245. To the right of the central spacer leg 247, a spacer leg 249 is disposed. The spacer leg 249 is approximately the same size as the spacer leg 245 and is smaller than the central spacer leg 247. Lastly, the right end portion includes a spacer leg 251 which is approximately the same size as the left hand end spacer leg 243 and smaller than the spacer leg 249.

Since the height and width of the various spacer legs can be controlled, the size of the gap between each spacer leg can also be controlled. A first gap 253 exists between the spacer legs 243 and 245; a second gap 255 exists between the second spacer leg 245 and the central spacer leg 247; a third gap 257 is disposed between the central spacer leg 247 and the right central spacer leg 249 and a fourth gap 259 exists between the right central spacer leg 249 and the right end spacer leg 251. It will be seen that the gap 253 is relatively narrow adjacent the first spacer leg 243 and extends to a greater height adjacent the spacer leg 245. Similarly, the left end of the second gap 255 has a height at its left hand end which is greater than the height at the right hand end of the first spacer slot 253 but a still greater height at the right hand end portion of the slot 255 adjacent the central spacer leg 247. The slots 257 and 259 are symmetric with the slots 253 and 255 and taper downward until the relatively short height of the slot 259 adjacent the outer right spacer leg 251 is disposed. These gaps 253, 257 and 259 are defined not only between the adjacent pairs of spacer legs 243, 245; 245, 247; 247, 249; 249, 251; respectively, but also between the upper surface 265 of the elongated member and the lower surface 275 of the member 241.

It will be seen that the gap or slots 253, 255,257, and 259 existing between the surfaces 275 and 265 and between adjacent spacer legs, as previously described, is relatively narrow adjacent the first or outer spacer legs 243 and 259 and continually linearly widens as it goes toward the center and reaches the second or intermediate spacer legs 245 and 249. The gap then continues to increase even further, in a linear manner, until it reaches the maximum height adjacent the intermediate spacer leg or central spacer leg 247.

On either side of the center spacer leg 247, the gap is the greatest whereas adjacent the inside of the outer legs 243 and 251, the gap or slot is its narrowest. The space between the first outer leg 243 and the first intermediate or left central spacer leg 245 establishes a first linearly increasing slot gap 253 while the remaining slot gaps 255, 257 and 259 are similarly formed as previously described and each linearly increases toward the center spacer leg 247.

The dimensions of the shaped slots 253, 255, 257, and 259 directly control the gas outlet flow and hence can be used to produce a predetermined desired velocity profile for the departing or injected gases. As the reactant gas passes through the slots 253, 255, 257 and 259, it moves vertically downward into the collection cavity 157 where it is turned 90° horizontally toward the reactant gas input 73 of the reaction chamber 59 and the gaps produce or establish an optimal predetermined desired velocity profile for the gas injected into or entering the gas inlet 73 of the chamber 59 to insure an optimal uniform deposition of the wafer to be processed.

The injector of FIG. 8 shows a generally elongated top block 221 having a block body 223 and a pair of downwardly distending side portions 233 and 235. The block 223 includes a top surface 225, a bottom surface 227, a left end surface 229 and a right end surface 231. A gap or space 239 exists between the lower surface 227 of the block 223 and the top surface 271 of the member 241. A Teflon-gasket 237 is positioned within the space 239 for sealing purposes as know in the art. The member 241 includes an upper surface 271, a lower gap defining surface 275, and end portion 273. The member 241 is at least partially disposed within a hollow cavity formed between the lower surface 227 of the block portion 223 and the interior surfaces of the downwardly extending flange portions 235. Lastly, the elongated block 261 is disposed below the spacer legs 243, 245, 247, 249 and 251 and includes an upper surface 265 generally abutting the bottom of the leg portions, a lower portion 263, and end portions 267 and 269. The cavity formed within the block member 223 and its downwardly distending flanges 233 and 235 is substantially closed by the member 261 except for the gaps 253, 255, 257 and 259 formed between the top surface 265 of the closure member 267 and the spacer leg and gap forming member 241.

Figure 9:
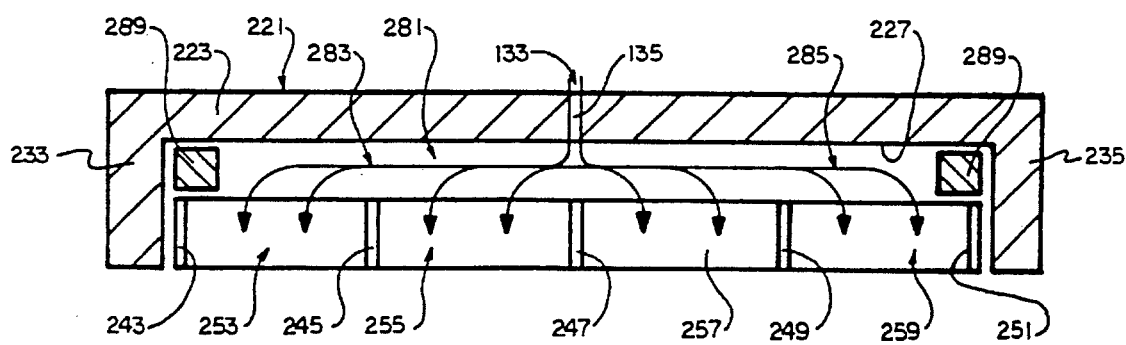
FIG. 9 is a sectional front view taken along view lines 9—9 of FIG. 7.

FIG. 9 illustrates a stream of reactant gas entering the central reactant gas inlet 135 and passing through the channels 135 (and 137, not shown) and entering the horizontal gas distribution cavity 281. The gases distributed horizontally to the left as indicated by gas distribution path 283 and to the right as indicated by gas distribution path 235 throughout the horizontally disposed gas distribution cavity 281. The gas then passes vertically downward and is turned at 90° to pass through the shaped or formed slots 253, 255, 257, and 259. Spacer blocks 289 are disposed within the gas distribution cavity 281 to space the member 241 which includes the legs 243, 245, 247, 249 and 251 from the inner surface 227 of the body portion 223. The flow direction of the gas is then changed 90° so as to flow horizontally through the shaped slots 253, 255, 257, and 259 between the spacer legs 243, 245, 247, 249 and 251, respectively, for producing the predetermined desired shaped velocity profile of the reactant gas injected into, entering, and passing through the reaction chamber 59.

FIG. 10 illustrates a source of reactant gas 291 connected via a conduit 297 to a valve 299. The valve 299 connects via an inlet conduit 301 to a reactant gas outlet 303. The outlet 303 can be connected to the gas inlet 133 of the injectors 71 of the present invention for supplying reactant gas thereto.

FIG. 11 illustrates yet another source of a gas "X" indicated by block 293 and a gas "Y" represented by block 295. While these may represent any gas including carrier gases, reactant gases, dopant gases, etchant gases, and the like, they may also typically include hydrogen and nitrogen which are used in epitaxial deposition systems. The outlet of the block 293 is connected via conduit 305 to a valve 309 while the outlet of the second gas of block 295 is connected via a conduit 307 to the valve 309. Valve 309 may be a simple toggle valve for selecting either one of the gases of blocks 293 or 295, as desired, and its output is taken through conduit 311 to a gas outlet 313. The outlet 313 can be connected to the inlet 133 of the injector 71 of the present invention for supplying a desired gas thereto.

In the preferred embodiment of the present invention, the wafers to be processes are typically silicon semi-conductor wafers, since epitaxial deposition is the deposition of a single crystal layer on a substrate (often, but not always of the same composition as the deposited layer), such that the crystal structure of the layer is an extension of the crystal layer of the substrate. In the present case, we can assume that a layer of silicon is being deposited onto the surface of the silicon The susceptor typically includes a graphite (carbon) body having a thin coating of silicon carbide over the outer surface thereof. The graphite is "susceptible" to be heated. The "flush" gas used at the beginning and end of each deposition is typically a non-reactive gas, such as nitrogen, which is used to flush away unwanted gases from the reaction chamber. Prior to the reactor heat-up, any residual air that may inadvertently have entered the chamber is removed by the flush process. A carrier gas such as hydrogen is used in the preferred embodiment of the present invention, although helium may also be used. The gases used in almost all epitaxial depositions of silicon are compounds containing one silicon atom and four other atoms that are either chlorine or hydrogen or a combination of the two. The four most commonly used sources of silicon include Silane ($SiH_4$); Dichlorosilane ($SIH_2Cl_2$); Trichlorosilane ($SIHCl_3$); and Silicon Tetrachloride ($SICl_4$). Similarly, the gases most commonly used to control the type of conductivity and the resistivity of the epitaxial layer must be compatible with the gases already present in the reaction chamber. These are referred to as dopant gases and the most commonly used include Arsine ($AsH_3$); Phosphine ($PH_3$) and Diborane ($B_2H_6$).

It will also be understood that various etchant gases can used prior to the actual epitaxial deposition. The etching is performed to remove a thin layer of silicon from the surface of the wafer together with any crystal damage that is present in it. The etching prepares sites for nucleating or initiating the deposition process.

It will be understood that the improved injectors described herein can be used in any situation where it is desired to have a predetermined desired shaped velocity profile to the injected reactant gases. While the preferred embodiment of the present invention finds particular Use in an epitaxial deposition system for processing semiconductor wafers or substrates on s single wafer-at-a-time basis, they could also be used in conventional batch processors or the like.

For additional details on the system of the preferred embodiment of the present invention, in which the improved injector described herein finds particular use, the common Assignee's copending patent applications listed below are expressly incorporated by reference herein. The incorporated by reference copending patent applications include:

1. U.S. Pat. No. 4,821,674, filed Mar. 31, 1987, entitled "ROTATABLE SUBSTRATE SUPPORTING MECHANISM WITH TEMPERATURE SENSING DEVICE FOR USE IN CHEMICAL VAPOR DEPOSITION EQUIPMENT."
2. U.S. Pat. No. 5,080,549, filed Jul. 2, 1990, entitled "WAFER HANDING SYSTEM WITH BERNOULLI PICK-UP".
3. U.S. Pat. No. 4,836,138, filed Jun. 18, 1987, entitled "HEATING SYSTEM FOR REACTION CHAMBER 0F CHEMICAL VAPOR DEPOSITION EQUIPMENT".
4. U.S. Pat. No. 4,846,102, filed Jun. 24, 1987, entitled "REACTION CHAMBERS FOR CVD SYSTEMS:

It will be recognized, by those skilled in the art, that various modifications, variations, alterations, substitutions, and changes can be made in the structure, components, materials, and the method of operation set forth In the preferred embodiments described herein without departing from the spirit and scope of the present invention, which is limited only by the appended claims.

What is claimed is:

1. Chemical vapor deposition apparatus comprising:

walls forming a reaction chamber defining a generally horizontal longitudinal axis for processing semiconductor wafers;

a single rotatable susceptor horizontally positioned in the chamber sized to support a single wafer, the susceptor being centrally located on a lateral chamber axis;

a gas input port for supplying process gas into said chamber adjacent an upstream edge of said susceptor with the gas flowing across a flat surface of the wafer in a direction in substantial alignment with the longitudinal axis, said port extending laterally, substantially across the width of the chamber;

a gas exhaust port for withdrawing gas from said chamber adjacent a downstream edge of the susceptor opposite from the input port; and gas injector apparatus including a plurality of laterally spaced outlets which control gas flow leading to said inlet port, in a manner to provide a non-uniform gas velocity profile having a greater velocity in a central region and a lesser velocity in laterally outward regions so that greater reaction gas flow is provided across the center of the wafer than across the lateral edges of the wafer to provide uniform deposition on the wafer.

2. The deposition apparatus of claim 1, wherein said outlets are smaller at said outward regions than at said central region.

3. The deposition apparatus of claim 1, wherein said outlets are apertures in a wall.

4. The deposition apparatus of claim 1, wherein said outlet are circular.

5. The deposition apparatus of claim 1, wherein said outlets are separated by a plurality of spacer legs.

6. The deposition apparatus of claim 1, wherein said outlets are in the form of horizontally elongated slots.

7. The deposition apparatus of claim 1, including a conduit connecting a source of gas to said injector apparatus, a value in said conduit controlling the flow of gas to the injector apparatus.

* * * * *